(12) United States Patent
Sim et al.

(10) Patent No.: US 8,592,247 B2
(45) Date of Patent: Nov. 26, 2013

(54) METHOD OF FABRICATING AVALANCHE PHOTODIODE

(75) Inventors: Jae Sik Sim, Daejeon (KR); Ki Soo Kim, Daejeon (KR); Bong Ki Mheen, Daejeon (KR); Myoung Sook Oh, Daejeon (KR); Yong Hwan Kwon, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 20 days.

(21) Appl. No.: 13/273,257

(22) Filed: Oct. 14, 2011

(65) Prior Publication Data

US 2012/0156826 A1    Jun. 21, 2012

(30) Foreign Application Priority Data

Dec. 20, 2010    (KR) ................ 10-2010-0130537

(51) Int. Cl.
*H01L 21/00*    (2006.01)
(52) U.S. Cl.
USPC ................................ 438/91; 257/E21.357
(58) Field of Classification Search
USPC ............... 438/91, 380, 983; 257/E21.355, 257/E21.357
See application file for complete search history.

(56) References Cited

U.S. PATENT DOCUMENTS 6,492,239 B2 * 12/2002 Yang et al. .............. 438/380

FOREIGN PATENT DOCUMENTS

| KR | 2000-0024447 A | 5/2000 |
|---|---|---|
| KR | 2004-0032026 A | 4/2004 |
| KR | 2008-0024369 A | 3/2008 |
| KR | 2010-0065706 A | 6/2010 |
| KR | 2010-0071693 A | 6/2010 |

OTHER PUBLICATIONS

Kyung-Sook Hyun et al., "Pre-breakdown suppression in planar InP/InGaAs avalanche photodiode using deep floating guard ring", Applied Physics Letters, vol. 85, No. 23, pp. 5547-5549, Dec. 6, 2004.
K. H. Yoon et al., "Edge Breakdown Suppression of 10Gbps Avalanche Photodiode", Journal of the Korean Physical Society, vol. 45, pp. S936-S940, Dec. 2004.
J. N. Haralson II et al., "Numerical Simulation of Avalanche Breakdown within InP-InGaAs SAGCM Standoff Avalanche Photodiodes", Journal of Lightwave Technology, vol. 15, No. 11, pp. 2137-2140, Nov. 1997.

* cited by examiner

*Primary Examiner* — Quoc Hoang
(74) *Attorney, Agent, or Firm* — Rabin & Berdo, P.C.

(57) ABSTRACT

A method includes: forming an epitaxy wafer by growing a light absorbing layer, a grading layer, an electric field buffer layer, and an amplifying layer on the front surface of a substrate in sequence; forming a diffusion control layer on the amplifying layer; forming a protective layer for protecting the diffusion control layer on the diffusion control layer; forming an etching part by etching from the protective layer to a predetermined depth of the amplifying layer; forming a first patterning part by patterning the protective layer; forming a junction region and a guardring region at the amplifying layer by diffusing a diffusion material to the etching part and the first patterning part; removing the diffusion control layer and the protective layer and forming a first electrode connected to the junction region on the amplifying layer; and forming a second electrode on the rear surface of the substrate.

10 Claims, 5 Drawing Sheets

METHOD OF FABRICATING AVALANCHE PHOTODIODE

CROSS-REFERENCE TO RELATED APPLICATIONS

This application is based on and claims priority from Korean Patent Application No. 10-2010-0130537, filed on Dec. 20, 2010, with the Korean Intellectual Property Office, the present disclosure of which is incorporated herein in its entirety by reference.

TECHNICAL FIELD

The present disclosure relates to a method of fabricating an avalanche photodiode (APD) suitable for a photodetector.

BACKGROUND

In order to satisfy an increasing information and communication amount, an information and communication system having a large capacity and an ultra speed has been required. In a backbone network, a total transmission capacity is expected to reach several hundreds or several terabytes based on a basic transmission amount of tens of gigabyte bands.

Meanwhile, a photodetector having high sensitivity is required even in a receiving unit of a laser radar for a medical use or a 3-dimensional image and in this case, when the photodetector having a high reception is used, good transmission quality and excellent image data can be acquired without using a photoamplifier. Herein, an avalanche photodiode is used as a light receiving element of the photodetector having the high receive sensitivity.

The avalanche photodiode has a complicated structure and a difficult fabricating method and is fabricated so as to have a planar type because of reliability, as compared with a pin photodiode. However, since the avalanche photodiode having the planar type uses a diffusion process in which a p-type impurity is injected into only a patterned portion, a pre-breakdown due to an undesirable junction curvature occurs. In order to solve the problem, a guardring structure is proposed to maintain a high electric field at only the center of a junction region. The guardring structure means a structure in which an region having a small diffusion depth is formed around the junction region in order to prevent a junction breakdown from being easily generated at edge regions of the junction region.

The diffusion depth of an impurity (for example, Zn) is different from an absorbing layer in the guardring structure, such that an impurity diffusion process is to be performed two times. However, the impurity diffusion process has a lack of reproducibility, such that it is difficult to form a desired guardring structure by simply performing the continuous diffusion process twice. In addition, because the diffusion process needs to be performed twice, the manufacturing process is complicated and the manufacturing process efficiency is deteriorated.

Meanwhile, in the manufacturing of the avalanche photodiode, in order to improve reproducibility and reliability, a technology of controlling the diffusion depth of the junction region in the formation of the junction region is proposed in Korean Patent Laid-open Publication No. 10-2010-0065706 (hereinafter, referred to as the related art). The related art improves the reproducibility of recess etching by inserting an etching stop layer 210 between a first amplifying layer 202 and a second amplifying layer 204 and improves the reliability of the manufacturing process by controlling an etching depth (see FIG. 4). However, in the related art, a characteristic of dark current (current flowing even when light is not blazing down) is deteriorated because the etching stop layer 210 made of InGaAs is not removed and remains, such that an electric characteristic of the avalanche photodiode is deteriorated. Further, because the amplifying layers are formed in a double layer, the manufacturing efficiency is deteriorated.

SUMMARY

The present disclosure has been made in an effort to provide a method of fabricating an avalanche photodiode capable of ensuring reproducibility and reliability and improving the manufacturing process efficiency by simplifying a diffusion process.

An exemplary embodiment of the present disclosure provides a method of fabricating an avalanche photodiode, including: forming an epitaxy wafer by growing a light absorbing layer, a grading layer, an electric field buffer layer, and an amplifying layer on the front surface of a substrate in sequence; forming a diffusion control layer on the amplifying layer; forming a protective layer for protecting the diffusion control layer on the diffusion control layer; forming an etching part by etching from the protective layer to a predetermined depth of the amplifying layer; forming a first patterning part by patterning the protective layer; forming a junction region and a guardring region at the amplifying layer by diffusing a diffusion material to the etching part and the first patterning part; removing the diffusion control layer and the protective layer and forming a first electrode connected to the junction region on the amplifying layer; and forming a second electrode on the rear of the substrate.

The diffusion control layer may be formed of a material selected from a group consisting of indium phosphate (InP), indium arsenic (InAs), indium gallium phosphate (InGaP), indium gallium arsenic (InGaAs), and indium gallium arsenic phosphate (InGaAsP).

The diffusion control layer may have a thickness of 0.01 to 0.3 μm.

The forming of the junction region and the guardring region at the amplifying layer may include: depositing a diffusion raw material at the etching part and the first patterning part; forming a diffusion inductive layer which induces the diffusion material to be diffused into the amplifying layer, on the protective layer and the diffusion raw material and heat-treating the diffusion inductive layer; and stabilizing the diffusion material.

The forming of the first electrode may include: forming an insulation layer on the amplifying layer, the guardring region, and the junction region after removing the diffusion control layer and the protective layer; forming a second patterning part by patterning the insulation layer; and depositing a first electrode material at the second patterning part.

According to exemplary embodiments of the present disclosure, in the avalanche photodiode, a junction region and a guardring region are formed by a diffusion process of one time, such that a manufacturing process is simple, thereby improving process efficiency. Further, since diffusion depths of the guardring region and the junction region can be controlled by a diffusion control layer, a pre-breakdown due to a junction curvature can be efficiently prevented, thereby ensuring the reproducibility and excellent reliability of the avalanche photodiode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, exemplary embodiments of the present disclosure will be described.

Figure 1A:
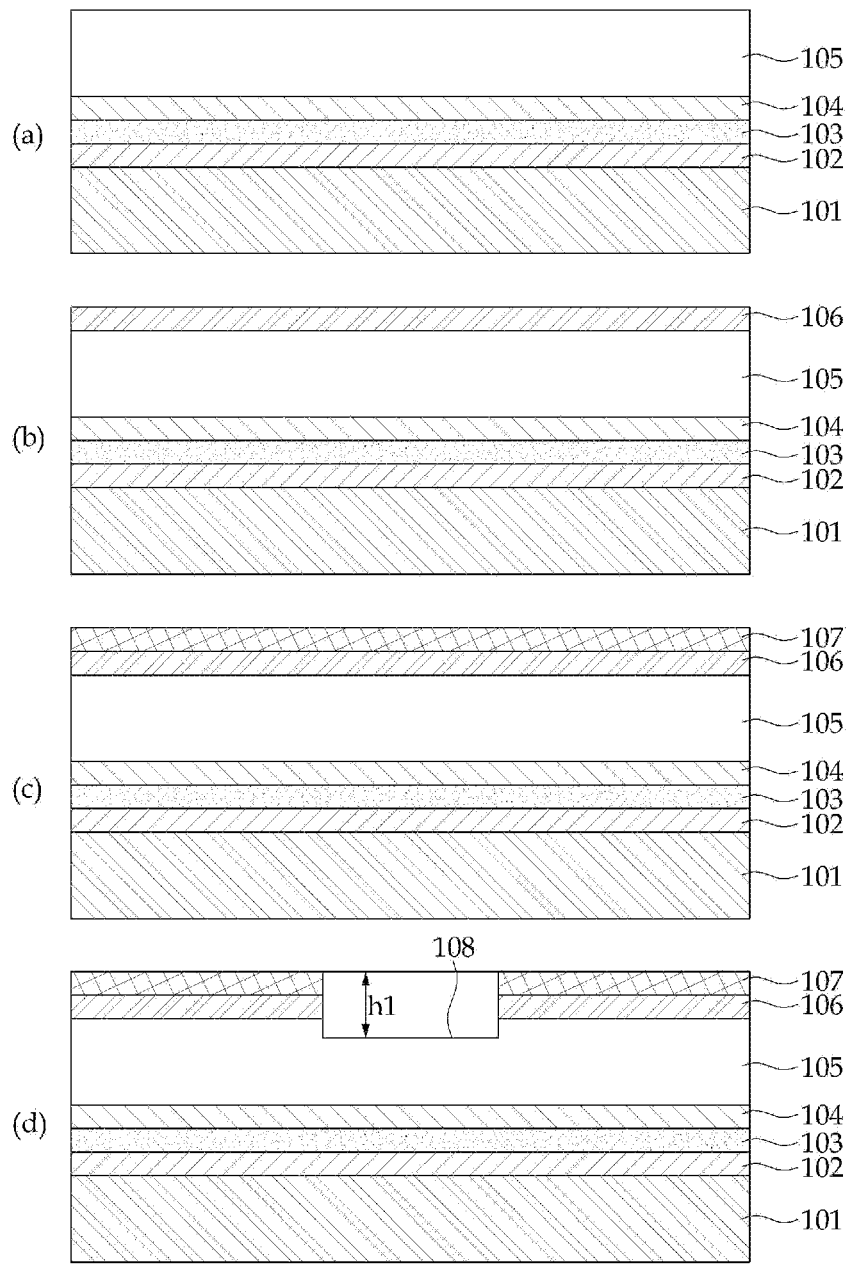
FIGS. 1A and 1B are sectional views illustrating a method of fabricating an avalanche photodiode according to an exemplary embodiment of the present disclosure.
Figure 1B:
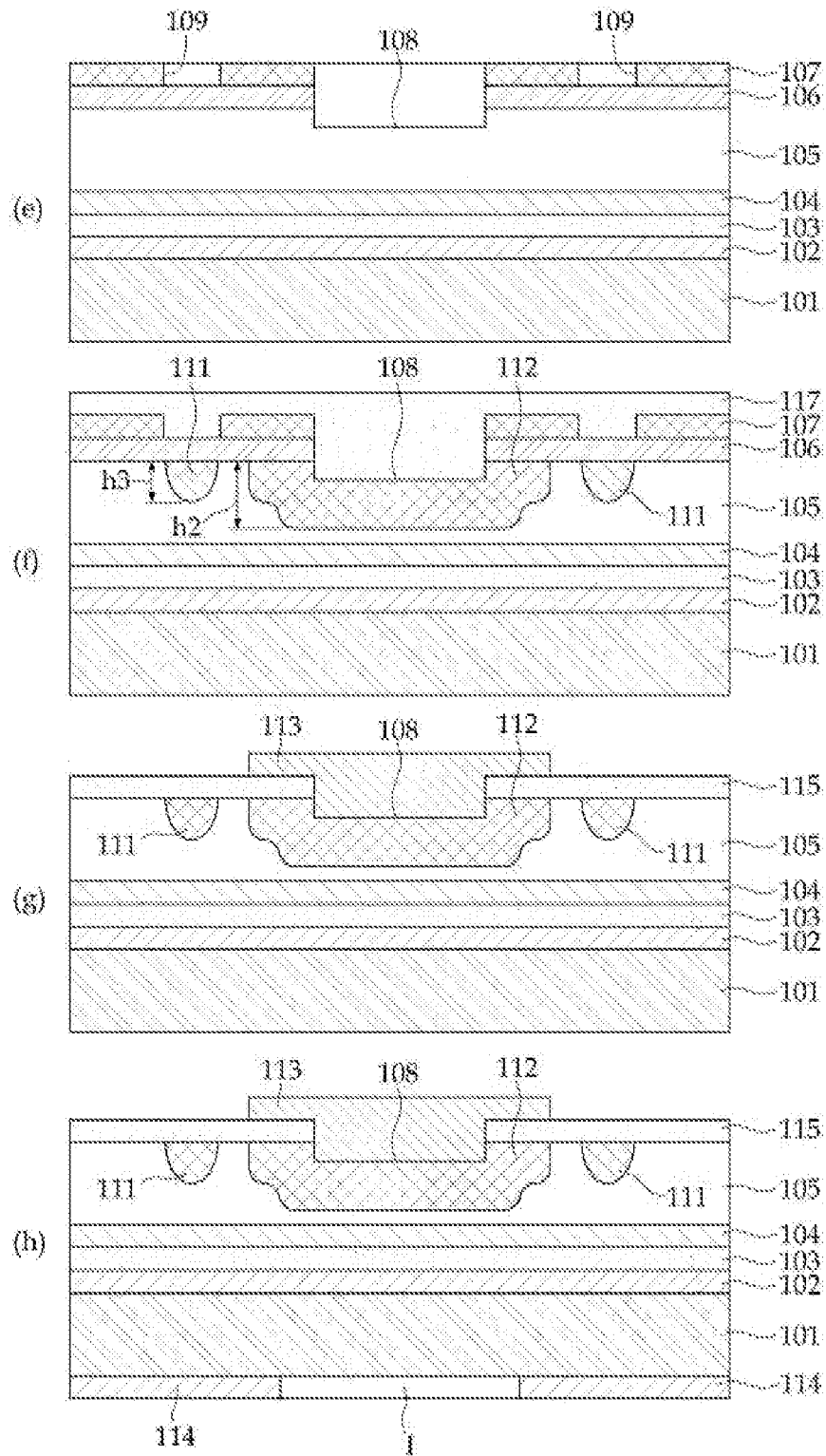

FIGS. 1A and 1B are a process sectional showing a method of fabricating an avalanche photodiode according to an exemplary embodiment of the present disclosure. In order to fabricate the avalanche photodiode according to the exemplary embodiment of the present disclosure, first, a light absorbing layer 102, a grading layer 103, an electric field buffer layer 104, and an amplifying layer 105 are sequentially grown at the front surface of a substrate 101 including an InP buffer layer (not shown) to form an epitaxy wafer (see (a) of FIG. 1A).

In this case, if a method of growing compositions of substrate 101 and each layer, and each layer is a known technology in the art, it is not particularly limited. However, in detail, by using a crystal thin film growth device such as a metal organic chemical vapor deposition (MOCVD) apparatus or a molecular beam epitaxy (MBE) or the like, n-InGaAs light absorbing layer 102, n-InGaAsP grading layer 103 which is laminated in several layers and is not doped, n-InP electric field buffer layer 104 which is doped by 3 to $4.5 \times 10^{17}$, and n-InP amplifying layer 105 which is laminated with a thickness of 3 to 4.5 µm are grown on InP substrate 101 in sequence.

Next, a diffusion control layer 106 is formed on formed amplifying layer 105 (see (b) of FIG. 1A). Herein, the method of forming diffusion control layer 106 is not particularly limited, but as a non-limiting example, diffusion control layer 106 may be formed by a crystal thin film growth device such as a metal organic chemical vapor deposition (MOCVD) apparatus or the like. In this case, a material used for forming diffusion control layer 106 may use Group III to V compound having a good lattice match with amplifying layer 105. A non-limiting example of the Group III-V compounds may be indium phosphate (InP), indium arsenic (InAs), indium gallium phosphate (InGaP), indium gallium arsenic (InGaAs), and indium gallium arsenic phosphate (InGaAsP) and among the compounds, indium gallium arsenic (InGaAs) having the best lattice-match with amplifying layer 105 may be used. Meanwhile, a thickness of formed diffusion control layer 106 is not particularly limited, but considering a time and a depth in which a diffusion material is diffused to amplifying layer 105, diffusion control layer 106 may be formed to have the thickness of 0.01 to 0.3 µm.

The diffusion control layer 106 is controlled a diffusion depths of guardring region 111 and junction region 112, when the diffusion material is diffused to amplifying layer 105 to form a guardring region 111 and a junction region 112 and it will be described below in detail.

When diffusion control layer 106 is formed, a protective layer 107 for protecting diffusion control layer 106 is formed on diffusion control layer 106 (see (c) of FIG. 1A). In general, the diffusion material is diffused to amplifying layer 105 at a high temperature of 500° C. or more. In this case, if diffusion control layer 106 is exposed, diffusion control layer 106 may not stand the high temperature to be damaged. Accordingly, protective layer 107 is formed in order to protect diffusion control layer 106 at the high temperature and a material which can be used as protective layer 107 is not particularly limited, but as an unlimited example, silicon oxide (for example, $SiO_2$) or silicon nitride (for example, $Si_3N_4$) may be used. In addition, a method of forming protective layer 107 is also not particularly limited, but a plasma deposition method or the like may be used.

Next, an etching part 108 is formed by etching from protective layer 107 to a predetermined depth of amplifying layer 105 (see (d) of FIG. 1A). Herein, as a diffusion raw material 110 is deposited and diffused, junction region 112 is formed at etching part 108, such that a depth h2 of junction region 112 is determined depending on a depth h1 of etching part 108. That is, depth h2 of junction region 112 corresponds to depth h1 of etching part 108, such that depth h2 of junction region 112 may be controlled by controlling depth h1 of etching part 108. Meanwhile, a method of forming etching part 108 is not particularly limited, but a recess etching may be performed by using a dry etching method. Considering depth h2 of junction region 112, depth h1 of etching part 108 may be 0.1 to 0.4 µm.

Thereafter, a first patterning part 109 is formed by patterning protective layer 107 (see (e) of FIG. 1A). As diffusion raw material 110 is deposited and diffused, guardring region 111 is formed at first patterning part 109. Meanwhile, a method of forming first patterning part 109 at protective layer 107 is not particularly limited. As a non-limiting example, first patterning part 109 may be formed by removing protective layer 107 at a portion to be patterned by a dry or wet etching, after performing exposing (UV radiating) and developing processes by using a photoresist.

Next, junction region 112 and guardring region 111 are formed on amplifying layer 105 by diffusing diffusion raw material 110 to etching part 108 and first patterning part 109 (see (f) of FIG. 1B) and it will be described in detail with reference to FIG. 2.

Figure 2:
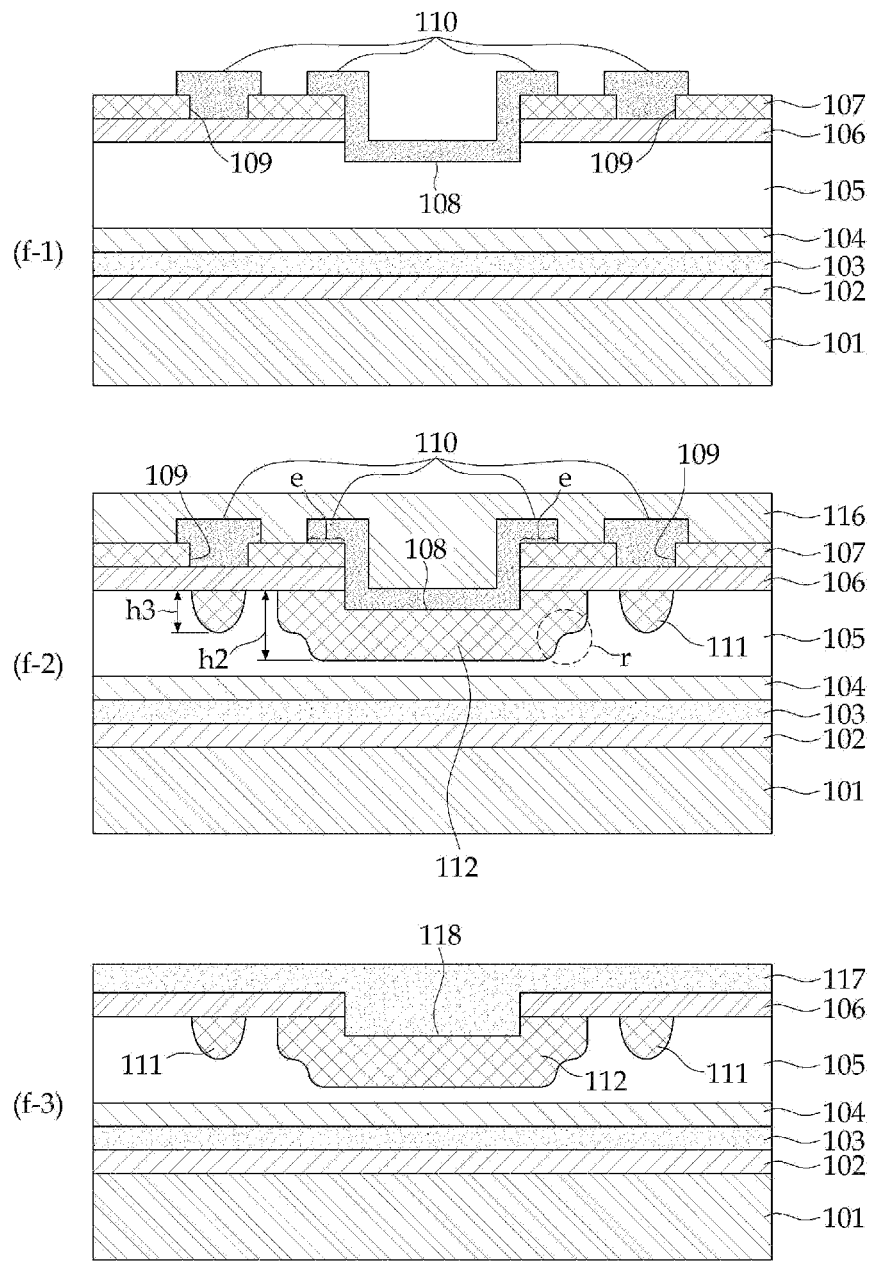
FIGS. 2 and 3 are sectional views illustrating a part of a method of fabricating an avalanche photodiode according to an exemplary embodiment of the present disclosure.

First, diffusion raw material 110 is deposited at etching part 108 and first patterning part 109 (see (f-1) of FIG. 2). In particular, ZnP as diffusion raw material 110 is deposited at etching part 108 and first patterning part 109 by using a thermal evaporator apparatus.

Next, a diffusion inductive layer 116 which induces the diffusion material to be diffused into amplifying layer 105 is formed on protective layer 107 and diffusion raw material 110 and then, heat-treated (see (f-2) of FIG. 2). When the diffusion process is preformed with diffusion raw material 110 exposed, since zinc (Zn) as the diffusion material cannot be smoothly diffused into the amplifying layer, diffusion inductive layer 116 is formed in order to prevent this. In addition, by forming diffusion inductive layer 116, although the diffusion material is exposed at the high temperature (500° C. or more), the diffusion material may be protected so as not to be deformed. Herein, a material used for diffusion inductive layer 116 and a method of forming diffusion inductive layer 116 are not particularly limited, but as a non-limiting example, a method of depositing silicon oxide (e.g., $SiO_2$) by means of a plasma-enhanced chemical vapor deposition (PECVD) apparatus may be used.

Thereafter, when diffusion inductive layer 116 is formed, zinc (Zn) as the diffusion material is diffused into amplifying layer 105 by heat-treatment at a temperature of 400 to 600° C. for 10 to 30 minutes and then, guardring region 111 and junction region 112 are formed at amplifying layer 105. In this case, the diffusion in etching part 108, since the diffusion material does not pass through diffusion control layer 106, the diffusion material is diffused by depth h1 of etching part 108. Also, the diffusion at an edge e of etching part 108, since the diffusion material is diffused by passing through diffusion control layer 106, junction region 112 having a curvature r is formed at amplifying layer 105. In addition, since the diffusion material is diffused in first patterning part 109 by passing through diffusion control layer 106, guardring region 111 is formed at amplifying layer 105.

As such, in the exemplary embodiment of the present disclosure, junction region 112 and guardring region 111 can be easily formed by the diffusion process once. In addition, by forming diffusion control layer 106 and etching part 108, the diffusion depths of junction region 112 and guardring region 111 can be controlled, thereby providing the avalanche photodiode having excellent reliability. That is, guardring region 111 as a portion diffused by passing through diffusion control layer 106 has a depth thinner than junction region 112 as a portion diffused without passing through diffusion control layer 106. As such, when the avalanche photodiode is fabricated so that a depth h3 of guardring region 111 is thinner than a depth h2 of junction region 112 (h2>h3), pre-breakdown of a junction curvature portion is reduced, thereby providing the avalanche photodiode having excellent reliability.

After diffusion raw material 110 is heat-treated so as to be diffused, zinc (Zn) as the diffusion material is stabilized through an activation process (see (f-3) of FIG. 2). In this case, a detailed method of stabilizing the diffusion material includes removing diffusion inductive layer 116 and diffusion raw material 110, depositing a diffusion material protective layer 117 for protecting the diffusion material, particularly, silicon oxide (e.g., $SiO_2$), and then, activating diffusion material protective layer 117 at the temperature of 400 to 550° C. for 10 to 30 minutes. Herein, a method of removing diffusion inductive layer 116 and diffusion raw material 110 is not particularly limited. Diffusion inductive layer 116 and diffusion raw material 110 may be removed by a wet etching method. In detail, diffusion inductive layer 116 is removed by using a dilute solution of fluoride-based composition (for example, BOE 6:1 or BOE 30:1) and then, diffusion raw material 110 may be removed by using a mixed solution of $HNO_3$:$H_2O$ at a certain ratio.

Meanwhile, when guardring region 111 and junction region 112 are formed at amplifying layer 105, diffusion control layer 106 and protective layer 107 are removed and a first electrode 113 connected to junction region 112 is formed on amplifying layer 105 (see (g) of FIG. 1B).

Figure 3:
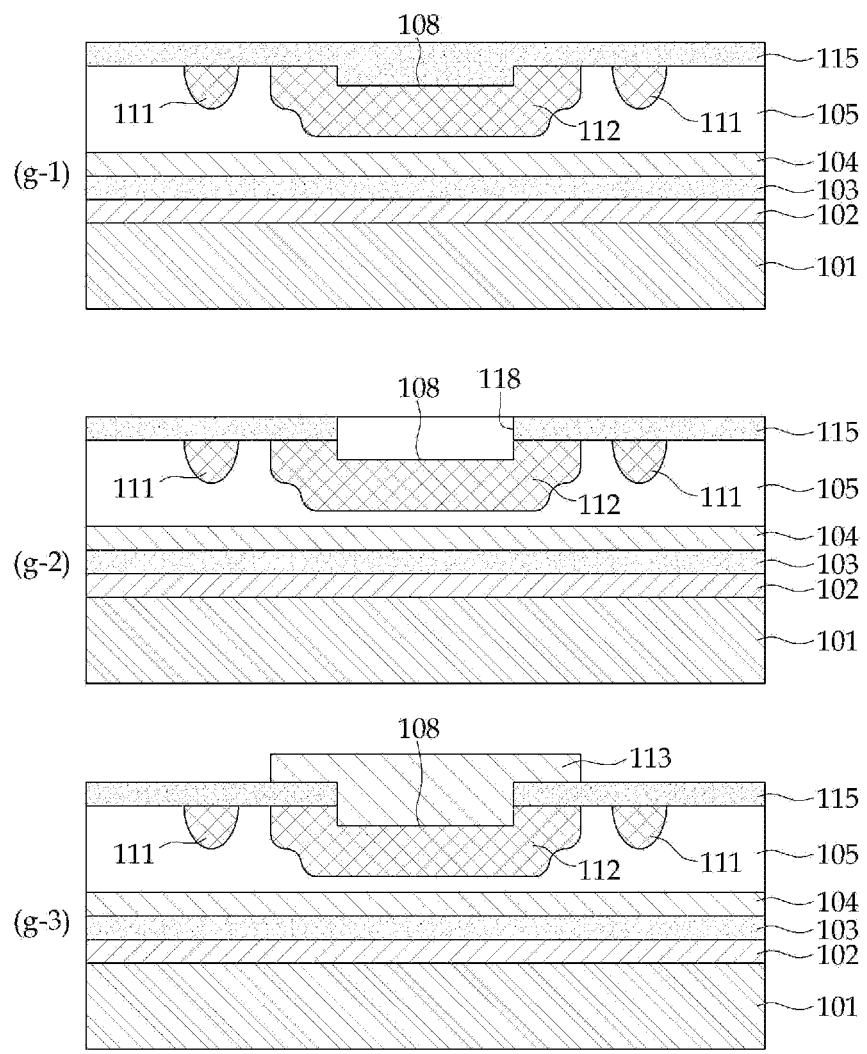
Figure 4:
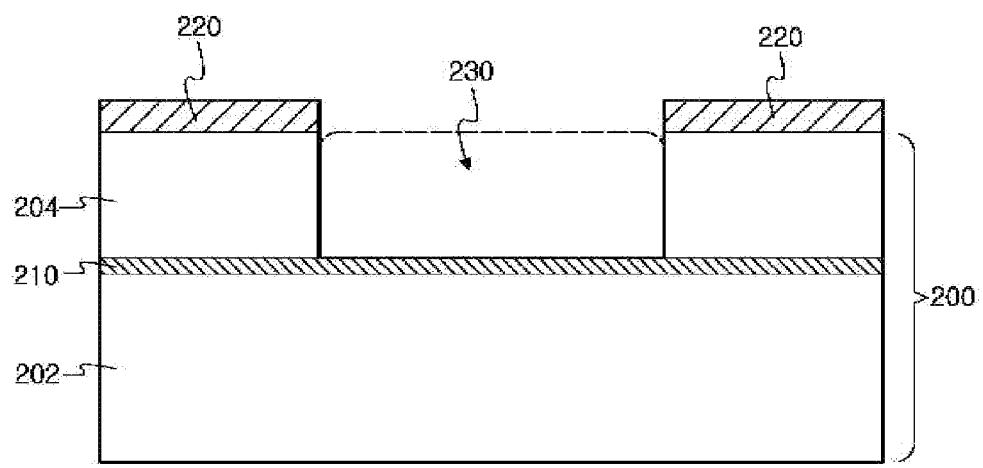
FIG. 4 is a sectional views illustrating an avalanche photodiode in the related art.

First, protective layer 107 and diffusion control layer 106 are removed by wet etching in sequence and an insulation layer 115 is formed on amplifying layer 105, guardring region 111, and junction region 112 (see (g-1) of FIG. 3). In this case, a method of wet-etching diffusion control layer 106 is not particularly limited. However, as a non-limiting example, a wet etching method using a dilute solution of phosphate-based composition (for example, a mixed solution of $H_3PO_4$:$H_2O_2$:$H_2O$ at a certain ratio) may be used. Meanwhile, a material usable as insulation layer 115 is not particularly limited. However, as a non-limiting example, silicon nitride (e.g., $Si_3N_4$) or silicon oxide (e.g., $SiO_2$) may be used. In addition, a method of forming insulation layer 115 is not particularly limited if the method is known in the art, but plasma enhanced chemical vapor deposition (PECVD), sputter, or the like may be used.

Thereafter, a second patterning part 118 is formed by patterning insulation layer 115 (see (g-2) of FIG. 3). Herein, a method of forming second patterning part 118 by patterning insulation layer 115 is not particularly limited if the method is known in the art. However, insulation layer 115 is partially patterned by using a photolithography process and then, etched by a react gas formed by adding $O_2$ gas to $C_2F_6$ to form second patterning part 118.

After second patterning part 118 is formed, a first electrode 113 is formed by depositing a first electrode material on second patterning part 118 (see (g-3) of FIG. 3). In detail, a p type electrode as first electrode 113 is formed by depositing p-metal as the first electrode material. Herein, a method of forming the p type electrode by depositing p-metal is not particularly limited if the method is known in the art.

Meanwhile, after first electrode 113 is formed, a second electrode 114 is formed at the rear of substrate 101 (see (h) of FIG. 1B). That is, an n type electrode as second electrode 114 is formed by lapping and polishing the rear of a substrate 101 by a thickness of 100 to 200 μm and then, depositing n-metal as a second electrode material. Herein, a method of forming the n type electrode by depositing the n-metal is not particularly limited if the method is known in the art.

Thereafter, the avalanche photodiode according to the method of the exemplary embodiment is fabricated by forming an incident part I at the rear of a substrate 101 which is a known technology in the art.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of fabricating an avalanche photodiode, comprising:
    forming an epitaxy wafer by growing a plurality of layers, which comprise an amplifying layer on the surface of a substrate;
    forming a diffusion control layer on the amplifying layer;
    forming a protective layer for protecting the diffusion control layer on the diffusion control layer;
    forming an etching part by etching from the protective layer to a predetermined depth of the amplifying layer;
    forming a first patterning part by patterning the protective layer;
    forming a junction region and a guardring region at the amplifying layer by diffusing a diffusion material to the etching part and the first patterning part;
    wherein the diffusion control layer controls a diffusion depth of the guardring region and the junction region, when a diffusion material is diffused to the amplifying layer to form the guardring region and the junction region.

2. The method of claim 1, wherein the diffusion control layer is formed of Group III-V compounds.

3. The method of claim 1, wherein the diffusion control layer is formed of a material selected from a group consisting of indium phosphate (InP), indium arsenic (InAs), indium gallium phosphate (InGaP), indium gallium arsenic (InGaAs), and indium gallium arsenic phosphate (InGaAsP).

4. The method of claim 1, wherein the diffusion control layer has a thickness of 0.01 to 0.3 μm.

5. The method of claim 1, wherein the protective layer is formed of silicon oxide or silicon nitride.

6. The method of claim 1, wherein the etching part has a depth of 0.1 to 0.4 μm.

7. The method of claim 1, wherein a depth of the junction region corresponds to the depth of the etching part.

8. The method of claim 1, wherein the forming of the junction region and the guardring region at the amplifying layer includes:

depositing a diffusion raw material at the etching part and the first patterning part;

forming a diffusion inductive layer which induces the diffusion material to be diffused into the amplifying layer on the protective layer and the diffusion raw material and heat-treating the diffusion inductive layer; and stabilizing the diffusion material.

9. The method of claim 1, further comprising:

removing the diffusion control layer and the protective layer and forming a first electrode connected to the junction region on the amplifying layer; and forming a second electrode on the rear surface of the substrate.

10. A method of fabricating an avalanche photodiode, comprising:

forming an epitaxy wafer by growing a light absorbing layer, a grading layer, an electric field buffer layer, and an amplifying layer on the front surface of a substrate in sequence;

forming a diffusion control layer on the amplifying layer;

forming a protective layer for protecting the diffusion control layer on the diffusion control layer;

forming an etching part by etching from the protective layer to a predetermined depth of the amplifying layer;

forming a first patterning part by patterning the protective layer;

forming a junction region and a guardring region at the amplifying layer by diffusing a diffusion material to the etching part and the first patterning part;

removing the diffusion control layer and the protective layer and forming a first electrode connected to the junction region on the amplifying layer; and forming a second electrode on the rear surface of the substrate;

wherein the diffusion control layer is formed of a material selected from a group consisting of indium phosphate (InP), indium arsenic (InAs), indium gallium phosphate (InGaP), indium gallium arsenic (InGaAs), and indium gallium arsenic phosphate (InGaAsP).

* * * * *